United States Patent
Chan et al.

(10) Patent No.: US 10,700,641 B1
(45) Date of Patent: Jun. 30, 2020

(54) MIXER BIAS CIRCUIT

(71) Applicant: REALTEK SEMICONDUCTOR CORPORATION, Hsinchu (TW)

(72) Inventors: Ka-Un Chan, Hsinchu County (TW); Rong-Fu Yeh, Taichung (TW); Chao-Huang Wu, Taoyuan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/729,548

(22) Filed: Dec. 30, 2019

(30) Foreign Application Priority Data

Jan. 2, 2019 (TW) .............................. 108100012 A (51) Int. Cl.
*H04B 1/18* (2006.01)
*H03D 7/12* (2006.01)
*H04B 1/16* (2006.01)
*H03F 3/45* (2006.01)

(52) U.S. Cl.
CPC ............... *H03D 7/125* (2013.01); *H04B 1/16* (2013.01); *H03D 2200/0088* (2013.01); *H03F 3/45* (2013.01)

(58) Field of Classification Search
CPC ............... H03D 7/1441; H03D 7/1433; H03D 2200/0043; H03D 7/1466; H03D 2200/0088; H03D 7/1425; H03D 3/009; H03F 3/245; H03F 3/347; H03F 3/45; H04B 1/30; H04B 1/16; H04B 1/40; H04B 7/125
See application file for complete search history.

(56) References Cited

U.S. PATENT DOCUMENTS

| | | | |
|---|---|---|---|
| 7,554,380 B2 | 6/2009 | Embabi et al. | |
| 7,711,395 B2* | 5/2010 | Oba | H03F 1/0261 |
| | | | 455/127.1 |
| 7,929,938 B2 | 4/2011 | Sellars et al. | |
| 8,000,676 B2 | 8/2011 | Kim et al. | |
| 8,121,579 B2* | 2/2012 | Shiramizu | H03D 7/1433 |
| | | | 455/131 |
| 8,498,598 B2* | 7/2013 | Basaran | H03D 7/1441 |
| | | | 455/226.1 |
| 8,676,145 B2 | 3/2014 | Kaczman et al. | |
| (Continued) | | | |

OTHER PUBLICATIONS

K. Kivekas, A. Parssinen, J. Ryynanen, J. Jussila, and K. Halonen, "Calibration Techniques of Active BiCMOS Mixers," IEEE J. Solid-State Circuits, vol. 37, pp. 766-769, Jun. 2002.

(Continued)

*Primary Examiner* — Nhan T Le
(74) *Attorney, Agent, or Firm* — WPAT, PC (57) ABSTRACT

The present invention discloses a mixer bias circuit including a first reference voltage generation circuit, an amplifier, a first transistor array, a first switch array, a second reference voltage generation circuit, a second transistor array, a second switch array, a first resistive component, and a second resistive component. The mixer bias circuit provides multiple bias voltages by dynamically tracking the common mode voltage of a trans-impedance amplifier (TIA) and compensates for imbalance and mismatch effects by asymmetrically trimming the bias voltages to improve the second-order intercept point of a radio frequency (RF) receiver front-end (RXFE).

7 Claims, 8 Drawing Sheets

(56) References Cited

U.S. PATENT DOCUMENTS

| | | | |
|---|---|---|---|
| 8,849,227 | B2 | 9/2014 | Feng et al. |
| 10,193,497 | B2 * | 1/2019 | Yu .......................... H04B 1/26 |
| 2007/0135075 | A1 | 6/2007 | Chiu et al. |
| 2011/0076961 | A1 | 3/2011 | Feng et al. |
| 2011/0201296 | A1 | 8/2011 | Kaczman et al. |
| 2014/0111252 | A1 | 4/2014 | Zhuo et al. |
| 2014/0355456 | A1 | 12/2014 | Jiang et al. |

OTHER PUBLICATIONS

M. Hotti, J. Kaukovuori, J. Ryynanen, J. Jussila, K. Kivekas, K. Halonen, "Dual-mode direct-conversion RF receiver with IIP2 calibration," IEEE Compound Semiconductor Integrated Circuit Symposium, pp. 183-186, Oct. 2004.

R.F. Ye, T.S. Horng, and J.M. Wu, "A Study of second-order nonlinearity in a single-ended RF input Gilbert mixer," in Proc. IEEE Asia-Pacific Microw. Conf., Suntec City, Singapore, Dec. 2009, pp. 1176-1179.

* cited by examiner

MIXER BIAS CIRCUIT

BACKGROUND OF THE INVENTION

1. Field of the Invention

The present invention generally relates to a mixer bias circuit, and, more particularly, to a mixer bias circuit having a second-order intercept point (hereinafter referred to as IP2) calibration function.

2. Description of Related Art

Figure 1:
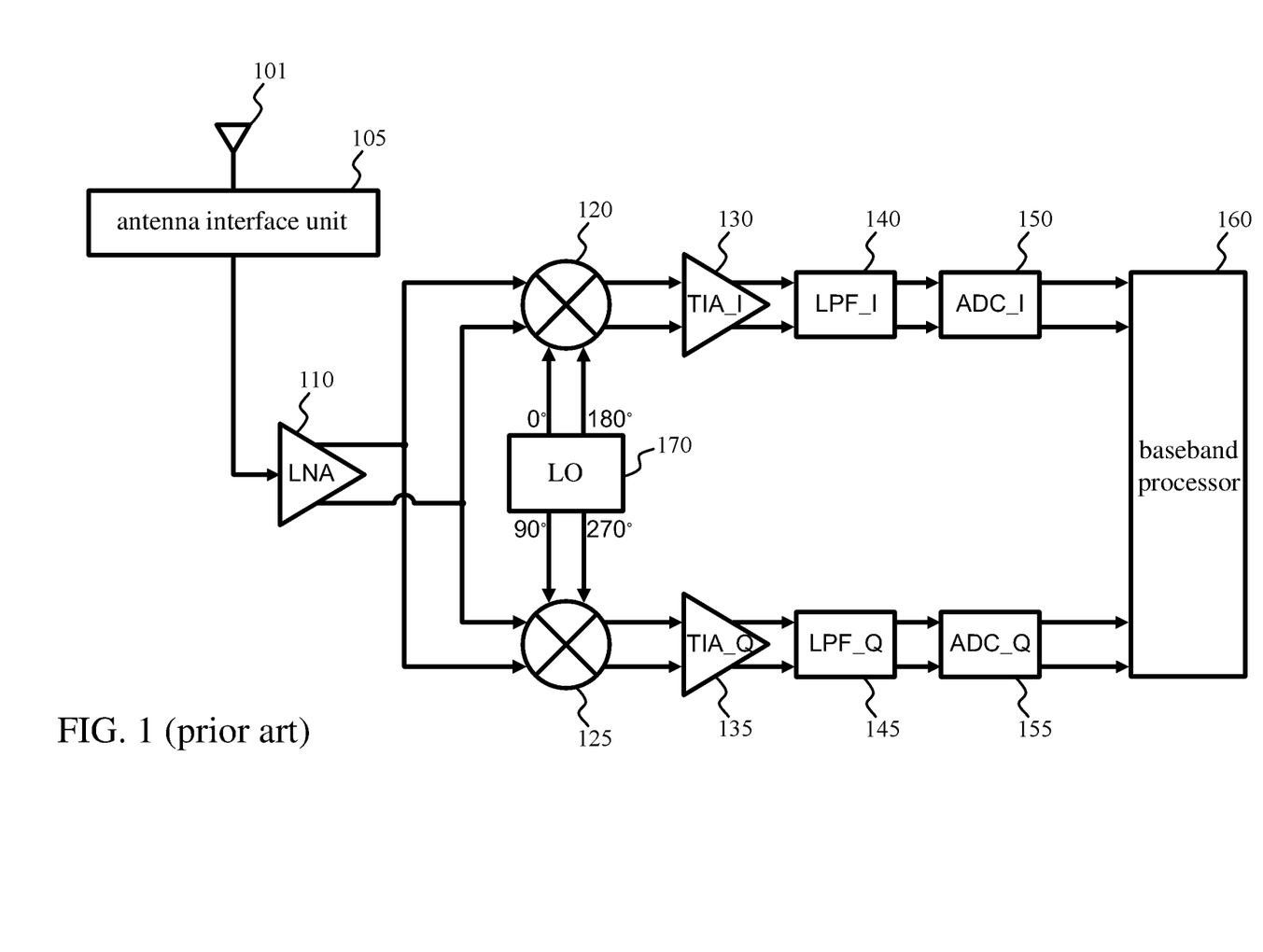
FIG. 1 illustrates a direct-conversion receiver.

Despite its wide use in a radio frequency (RF) transceiver due to its high integration and low power consumption, a mixer comprising metal-oxide-semiconductor field-effect transistors (MOSFETs) confronts some design challenges such as low output direct current (DC) offset and high linearity characterized by the IP2 and the third-order intercept point (hereinafter referred to as IP3). A conventional receiver can be implemented with a direct-conversion architecture, as shown in FIG. 1. The antenna 101 receives a downlink (DL) RF signal, and outputs the received DL RF signal to a low-noise amplifier (LNA) 110 via an antenna interface unit 105. The antenna interface unit 105 may be consisted of duplexers, switches, filters, and matching networks.

The LNA 110 is utilized to enhance the signal-to-noise ratio (SNR) of the received DL RF signal from the antenna 101, and provides the amplified DL RF signal to the input terminals of the in-phase path (I-path) mixer 120 and the input terminals of the quadrature-phase path (Q-path) mixer 125. Additionally, the local oscillator (LO) 170 generates two differential LO signals, which are the in-phase LO signal (denoted as 0° and 180°) and the quadrature-phase LO signal (denoted as 90° and 270°), respectively. The in-phase and quadrature-phase LO signals are fed into the mixer 120 and the mixer 125, respectively.

The mixer 120 mixes the amplified DL RF signal from the LNA 110 and the in-phase LO signal to down convert the in-phase part of the received DL RF signal. Similarly, the mixer 125 mixes the amplified DL RF signal from the LNA 110 and the quadrature-phase LO signal to down convert the quadrature-phase part of the received DL RF signal.

The down converted signal from the mixer 120 is fed into the I-path chain, which includes a trans-impedance amplifier (TIA_I) 130, a low-pass filter (LPF_I) 140 and an analog-to-digital converter (ADC_I) 150, to enlarge and recover the in-phase part of the received DL RF signal. Similarly, the down converted signal from the mixer 125 is fed into the Q-path chain, which includes a trans-impedance amplifier (TIA_Q) 135, a low-pass filter (LPF_Q) 145 and an analog-to-digital converter (ADC_Q) 155, to enlarge and recover the quadrature-phase part of the received DL RF signal. Furthermore, the baseband processor 160 receives the I-path and Q-path parts of the received DL RF signal from an RF receiver front-end (RXFE) to decode and process the digital stream into a standard communication form.

In the presence of a transmitter (TX) leakage in a frequency-division duplexing (FDD) system, a TX jammer-induced second order intermodulation distortion (hereinafter referred to as IMD2) product can be created at the mixer output and desensitizes the direct-conversion RF RXFE. For a time-division duplexing (TDD) system, the SNR of a wanted signal is significantly degraded by the IMD2 due to the out-of-band intermodulation effect when some beats interfere with a direct-conversion RF RXFE without utilizing a surface acoustic wave (SAW) filter.

Generally, the performance of a mixer suffers from various effects such as imbalance, mismatch, temperature, and fabrication process, subsequently influencing the IP2, DC offset, and image rejection ratio (IMR) performances of an RF RXFE. It is as well-known that a mixer performing frequency down-conversion is a significant IMD2 contributor in an RF RXFE. In the literatures, the IP2 calibration has been proposed to minimize the IMD2 product induced by mismatch and imbalance effects existing in a mixer. However, those proposed techniques are possibly under the influence of a common-mode voltage variation induced by a TIA, resulting in an IP2 degradation of the calibrated mixer.

Figure 2:
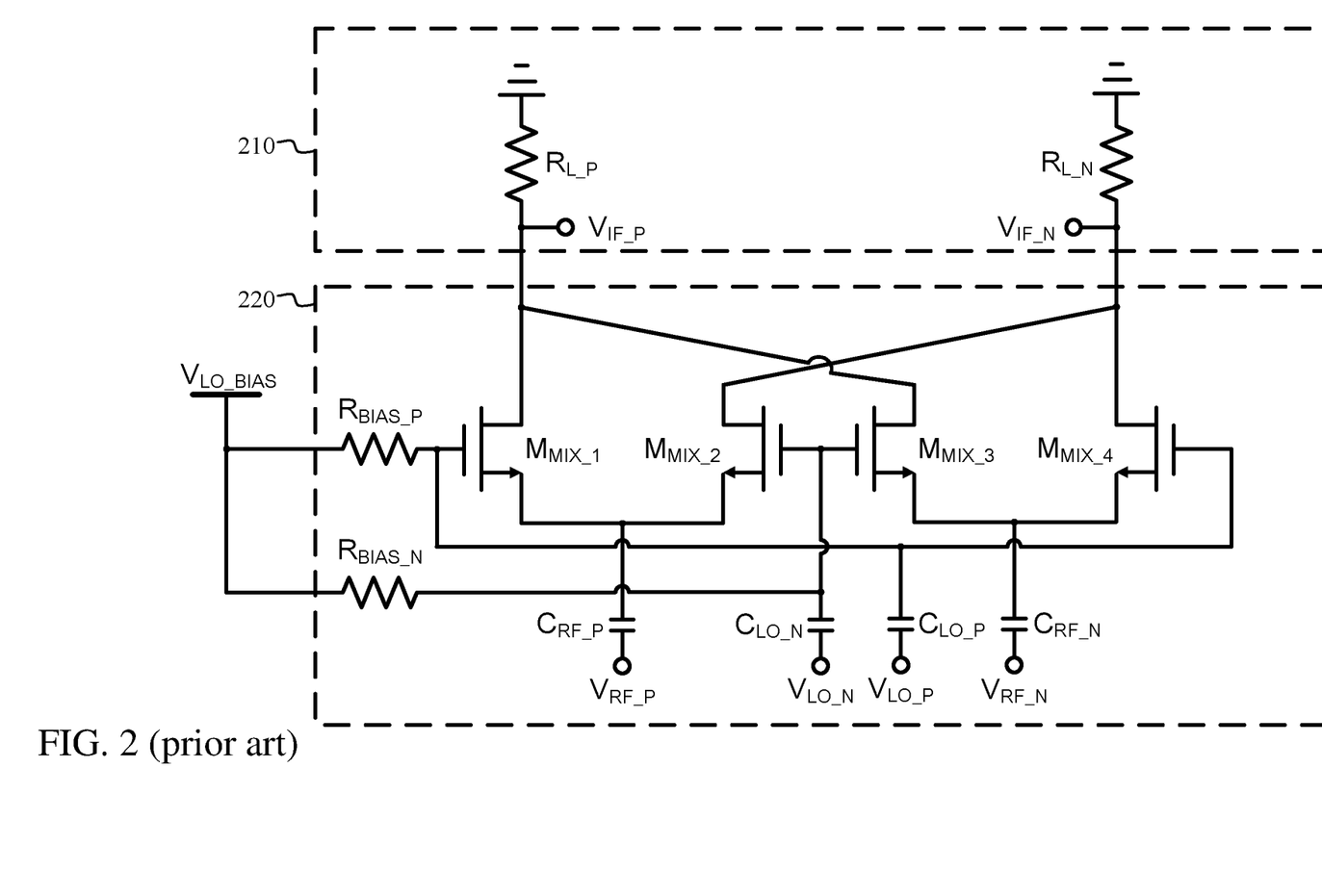
FIG. 2 illustrates a schematic diagram of a core of a conventional double-balanced mixer implemented with NMOSs.

FIG. 2 shows a schematic diagram of a mixer core 220 of a conventional double-balanced mixer implemented with N-channel MOSFETs (hereinafter referred to as NMOSs) $M_{MIX\_1}$, $M_{MIX\_2}$, $M_{MIX\_3}$ and $M_{MIX\_4}$. The mixer core 220 is coupled to the input impedance 210 of the TIA. A non-inverting LO signal $V_{LO\_P}$ is applied to the gate terminals of the switching transistors $M_{MIX\_1}$ and $M_{MIX\_4}$ via an alternating current (AC) coupling capacitor $C_{LO\_P}$. An inverting LO signal $V_{LO\_N}$ is applied to the gate terminals of the switching transistors $M_{MIX\_2}$ and $M_{MIX\_3}$ via an AC coupling capacitor $C_{LO\_N}$. Additionally, a DC gate bias voltage $V_{LO\_BIAS}$ via resistors $R_{BIAS\_P}$ and $R_{BIAS\_N}$ is applied to the gate terminals of the switching transistors $M_{MIX\_1}$ to $M_{MIX\_4}$ to make the switching transistors $M_{MIX\_1}$ to $M_{MIX\_4}$ operate in the switching mode under a LO sweeping in large signal. A non-inverting RF signal $V_{RF\_P}$ is applied to the source terminals of the switching transistors $M_{MIX\_1}$ and $M_{MIX\_2}$ via an AC coupling capacitor $C_{RF\_P}$. An inverting RF signal $V_{RF\_N}$ is applied to the source terminals of the switching transistors $M_{MIX\_3}$ and $M_{MIX\_4}$ via an AC coupling capacitor $C_{RF\_N}$. The drain terminals of the switching transistors $M_{MIX\_1}$ and $M_{MIX\_3}$ are coupled together to a resistor $R_{L\_N}$ which is an input resistor of the positive terminal $V_{IF\_N}$ in a TIA. The drain terminals of the switching transistors $M_{MIX\_1}$ and $M_{MIX\_4}$ are coupled together to a resistor $R_{L\_N}$ which is an input resistor of the negative terminal $V_{IF\_N}$ in the TIA. As mentioned above, the switching transistors $M_{MIX\_1}$ to $M_{MIX\_4}$ mixes LO and RF signals to achieve frequency translation because the switching transistors $M_{MIX\_1}$ to $M_{MIX\_4}$ operate in the switching mode. However, the nonlinear components such as the third order intermodulation distortion (hereinafter referred to as IMD3) and IMD2 would degrade the sensitivity of the RF RXFE. As mentioned above, a mixer in an RF RXFE is a significant contributor for the IMD2 nonlinear component. Additionally, the mismatch and asymmetrical effects existing in the electronic devices of a mixer would enlarge the IMD2.

Figure 3:
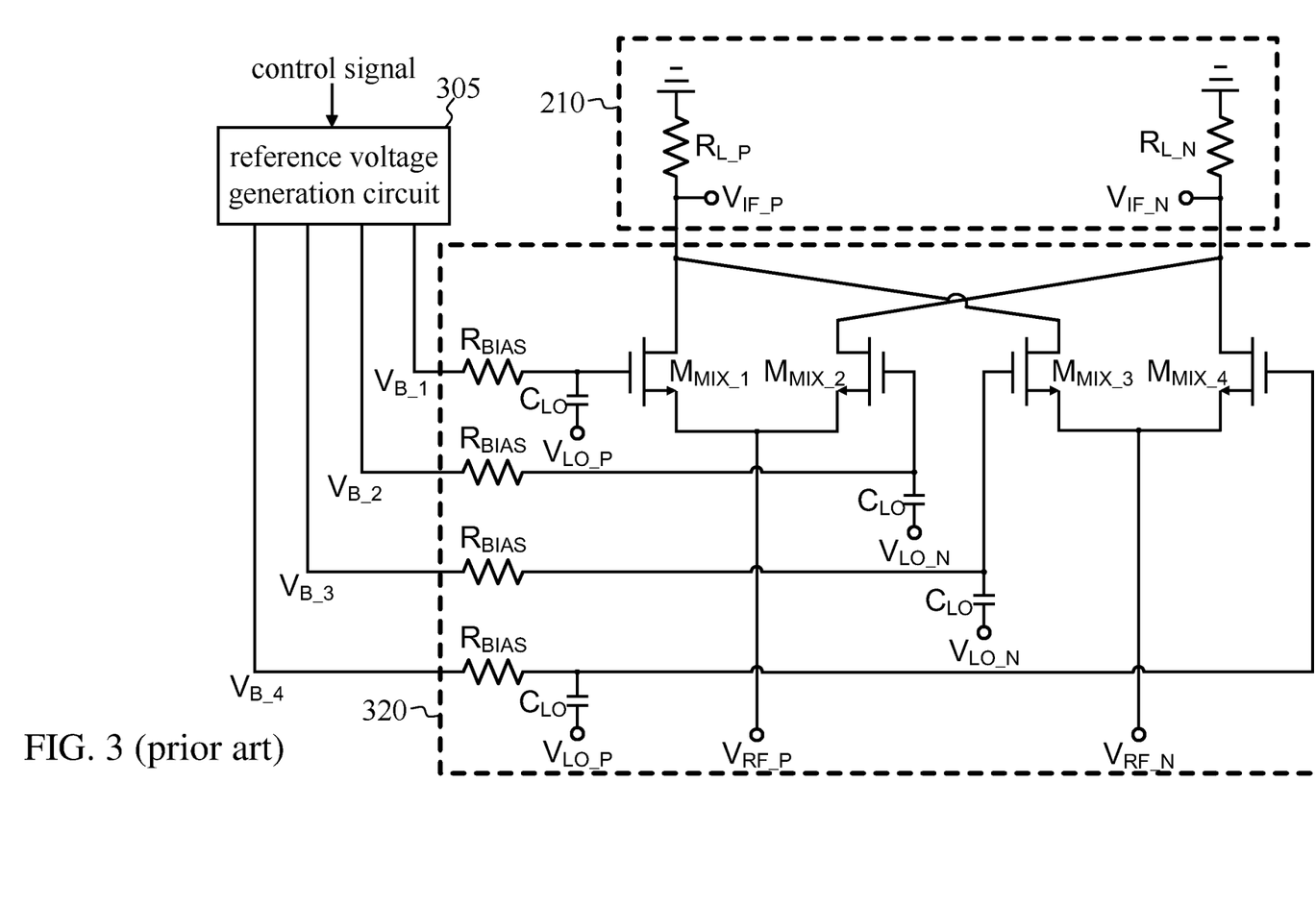
FIG. 3 illustrates a schematic diagram for compensating an imbalanced mixer via trimming gate bias voltages of the switching transistors in a mixer.

As shown in FIG. 3, the IP2 calibration technique that compensates an imbalanced mixer via trimming the gate bias voltages $V_{B\_1}$, $V_{B\_2}$, $V_{B\_3}$, and $V_{B\_4}$ of the switching transistors $M_{MIX\_i}$ to $M_{MIX\_4}$ in a mixer has been proposed to enhance the IP2 of a mixer. The gate bias voltages $V_{B\_1}$, $V_{B\_2}$, $V_{B\_3}$, and $V_{B\_4}$ are generated by the reference voltage generation circuit 305 according to the control signal and are respectively applied to the switching transistors $M_{MIX\_1}$, $M_{MIX\_2}$, $M_{MIX\_3}$ and $M_{MIX\_4}$, through the resistors $R_{BIAS}$. The numeral 320 denotes the core of the mixer. Moreover, the IP2 calibration algorithm has been widely used in an RF RXFE. Generally, the IMD2 would be enlarged when the mismatch, imbalance, and DC-offset effects present in the electrical devices of the RF RXFE. By asymmetrically trimming the gate bias voltages $V_{B\_1}$, $V_{B\_2}$, $V_{B\_3}$, and $V_{B\_4}$ of the switching transistors in a mixer, the imbalance and mismatch effects can be compensated, leading to improve the overall IP2 performance of the RF RXFE. However, the proposed IP2 calibration techniques still suffer from the common-mode voltage variation from a TIA, leading to a degradation of the optimized IP2.

SUMMARY OF THE INVENTION

In view of the issues of the prior art, an object of the present invention is to provide a mixer bias circuit to reduce the IMD2, so as to make an improvement to the prior art.

A mixer bias circuit applied to a radio frequency (RF) receiver front-end (RXFE) is provided. The RF RXFE includes a mixer and a trans-impedance amplifier (TIA). The mixer bias circuit has a first output terminal, a second output terminal, and a third output terminal that respectively output a first bias voltage, a second bias voltage, and a third bias voltage. The mixer bias circuit comprises a first reference voltage generation circuit, an amplifier, a first transistor array, a first switch array, a second reference voltage generation circuit, a second transistor array, a second switch array, a first resistive component and a second resistive component. The first reference voltage generation circuit is configured to generate a reference voltage according to a common-mode voltage of the TIA. The amplifier is coupled to the first reference voltage generation circuit and has a first input terminal for receiving the reference voltage, a second input terminal coupled to the second output terminal and for receiving the second bias voltage, and an output terminal. The first transistor array includes multiple first transistors. The first switch array is coupled between the first transistor array and the first output terminal and includes multiple first switches. A total number of the first switches that are to be turned on is based on a calibration code. The second transistor array includes multiple second transistors coupled to the second reference voltage generation circuit. The second switch array is coupled between the second transistor array and the third output terminal and includes multiple second switches. A total number of the second switches that are to be turned on is based on the calibration code. The first resistive component is coupled between the first output terminal and the second output terminal and has a first resistance. The second resistive component is coupled between the second output terminal and the third output terminal and has a second resistance.

The mixer bias circuit of the present invention provides a plurality of bias voltages by dynamically tracking the common-mode voltage of the TIA and compensates for imbalance and mismatch effects by asymmetrically trimming the bias voltages to thereby improve the IP2 at the radio frequency (RF) receiver front-end (RXFE).

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a mixer bias circuit. On account of that some or all elements of the mixer bias circuit could be known, the detail of such elements is omitted provided that such detail has little to do with the features of this disclosure and this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 4:
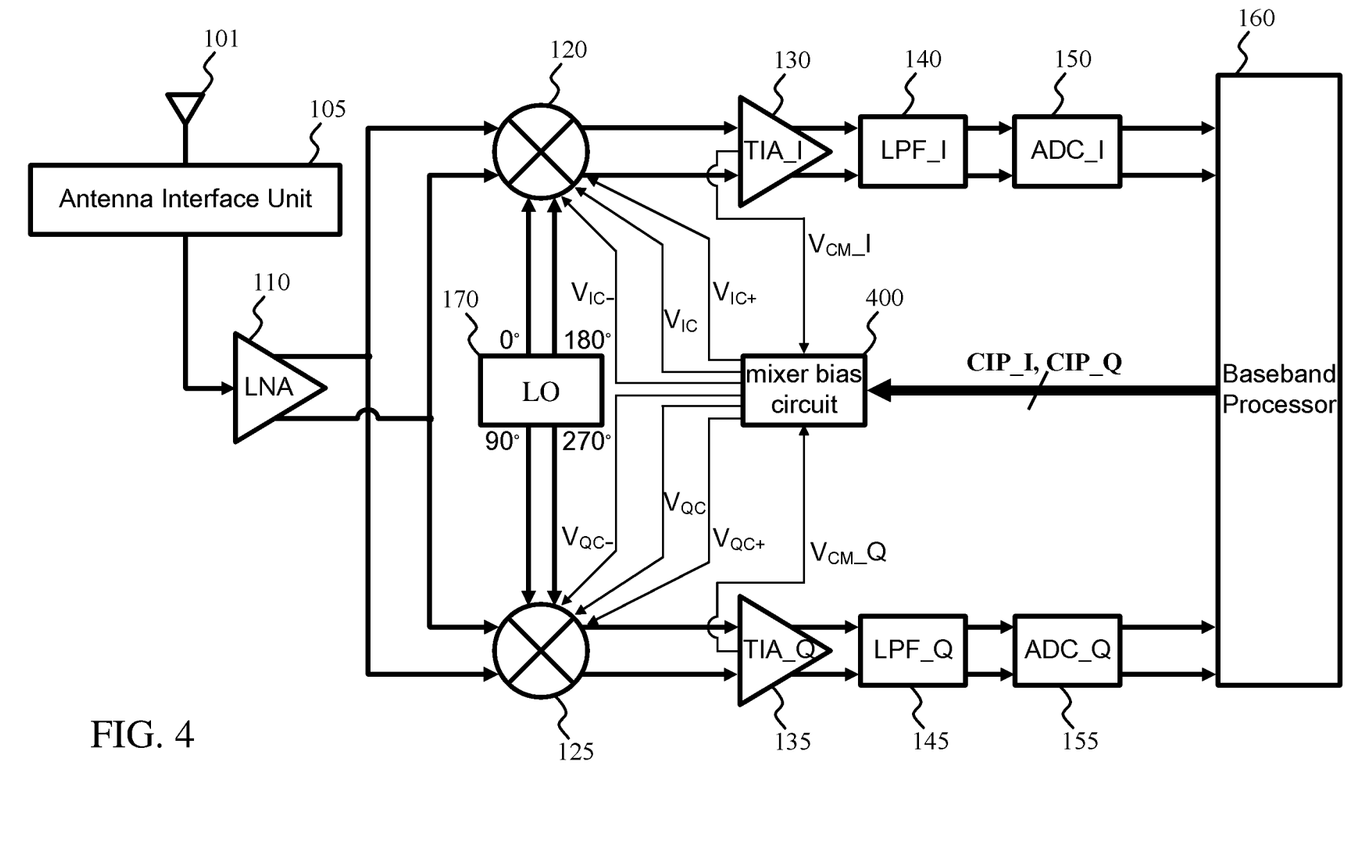
FIG. 4 illustrates a schematic diagram of a mixer bias circuit of the present invention applied to a radio frequency (RF) receiver front-end (RXFE).

FIG. 4 is a schematic diagram of a mixer bias circuit 400 of the present invention applied to a radio frequency (RF) receiver front-end (RXFE). The mixer bias circuit 400 can perform IP2 calibration on the mixer 120 for the I-path and the mixer 125 for the Q-path, respectively. For the I-path, the mixer bias circuit 400 generates the first bias voltage $V_{IC+}$, the second bias voltage $V_{IC}$ and the third bias voltage $V_{IC-}$ according to the calibration code CIP_I outputted by the baseband processor 160 and the common-mode voltage $V_{CM\_}I$ of the TIA 130. The first bias voltage $V_{IC+}$, the second bias voltage $V_{IC}$ and the third bias voltage $V_{IC-}$ are supplied to the mixer 120. For the Q-path, the mixer bias circuit 400 generates the first bias voltage $V_{QC+}$, the second bias voltage $V_{QC}$ and the third bias voltage $V_{QC-}$ according to the calibration code CIP_Q outputted by the baseband processor 160 and the common-mode voltage $V_{CM\_}Q$ of the TIA 135. The first bias voltage $V_{QC+}$, the second bias voltage $V_{QC}$ and the third bias voltage $V_{QC-}$ are supplied to the mixer 125. The calibration codes CIP_I and CIP_Q are generated by the baseband processor 160 according to the IP2 calibration algorithm. The IP2 calibration algorithm is a well-known technique.

Figure 5:
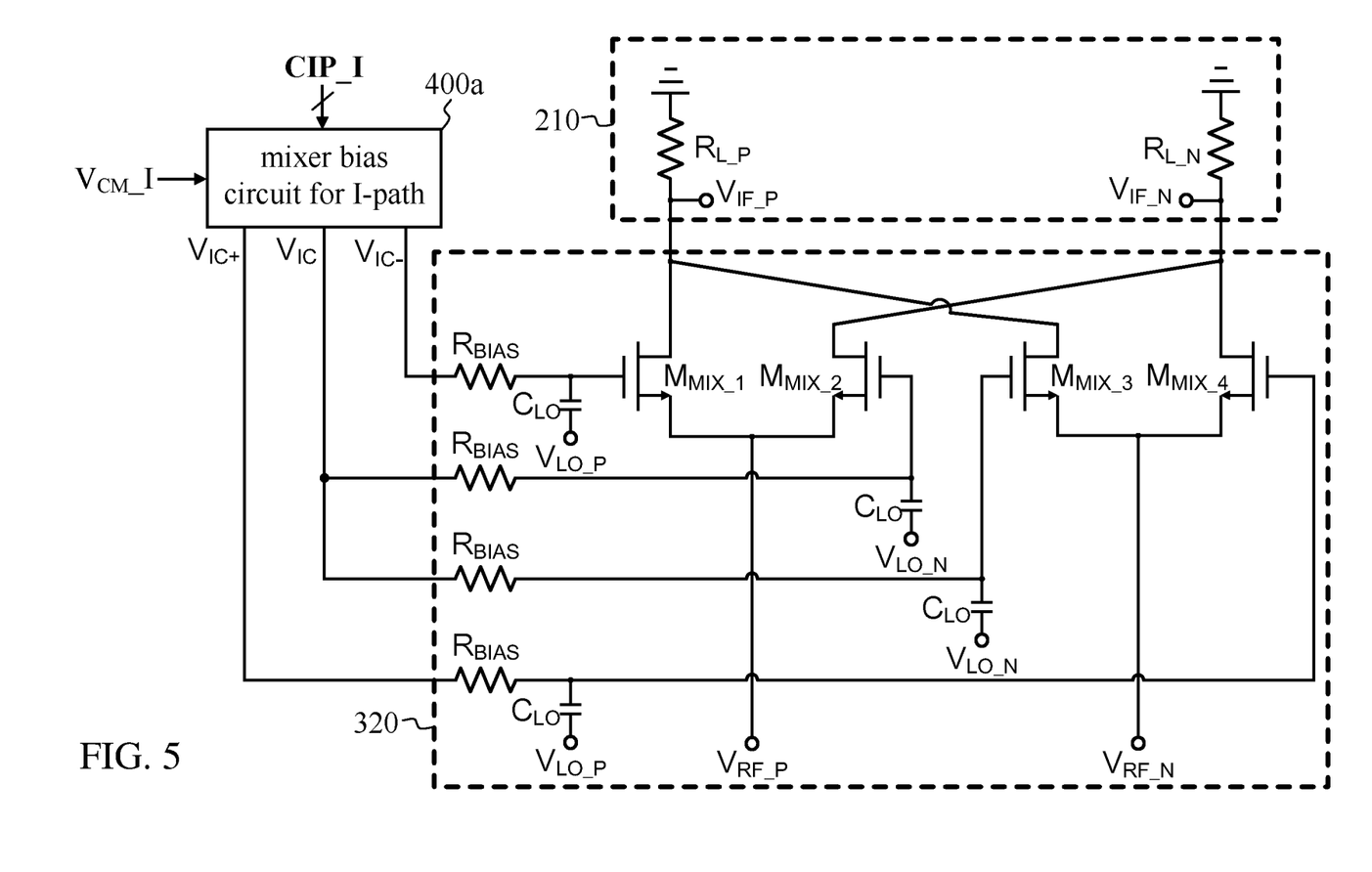
FIG. 5 illustrates a schematic diagram a mixer bias circuit of the present invention connected to a mixer core.

FIG. 5 is a schematic diagram the mixer bias circuit 400 of the present invention connected to a mixer core. As discussed in the prior art, the mixer bias circuit 400 includes circuitry for the I-path and circuitry for the Q-path. FIG. 5 shows the schematic diagram for the I-path, and in this example circuit, the mixer core 320 is the core of the mixer 120. The mixer bias circuit 400a for the I-path generates the first bias voltage $V_{IC+}$, the second bias voltage $V_{IC}$ and the third bias voltage $V_{IC-}$ according to the common-mode voltage $V_{CM\_I}$ and the calibration code CIP_I, and the first bias voltage $V_{IC+}$, the second bias voltage $V_{IC}$ and the third bias voltage $V_{IC-}$ are respectively outputted by the first, second and third output terminals of the mixer bias circuit 400a for the I-path. The mixer core 320 includes two transistor pairs—$M_{MIX\_1}$ and $M_{MIX\_2}$ being the first pair and $M_{MIX\_3}$ and $M_{MIX\_4}$ being the second pair. The gate of one of the transistors of each transistor pair receives the second bias voltage $V_{IC}$ through the resistor $R_{BIAS}$, and the gate of the other transistor receives the first bias voltage $V_{IC+}$ or the third bias voltage $V_{IC-}$ through the resistor $R_{BIAS}$.

Figure 6:
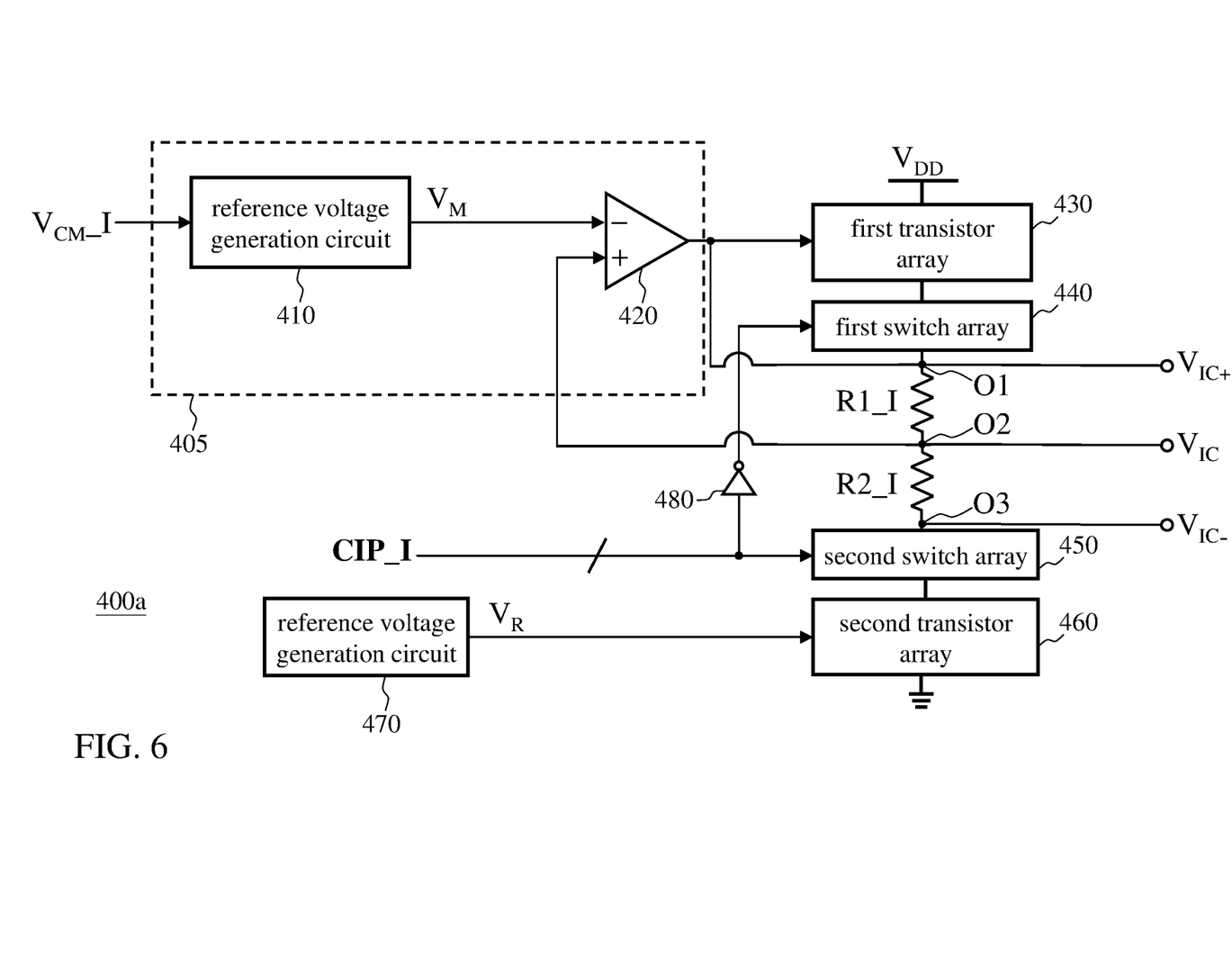
FIG. 6 illustrates a circuit diagram of a mixer bias circuit for the I-path according to an embodiment of the present invention.

FIG. 6 is a circuit diagram of a mixer bias circuit 400a for the I-path according to an embodiment of the present invention. The mixer bias circuit 400a for the I-path includes a reference voltage generation circuit 410, an amplifier 420, a first transistor array 430, a first switch array 440, a second switch array 450, a second transistor array 460, a reference voltage generation circuit 470 and an inverter 480. The mixer bias circuit 400a for the I-path outputs the first bias voltage $V_{IC+}$, the second bias voltage $V_{IC}$ and the third bias voltage $V_{IC-}$ through the first output terminal O1, the second output terminal O2 and the third output terminal O3, respectively. The reference voltage generation circuit 410 generates the reference voltage $V_M$ according to the common-mode voltage $V_{CM\_I}$.

A first input terminal of the amplifier 420 (e.g., the inverting input terminal) receives the reference voltage $V_M$. A second input terminal of the amplifier 420 (e.g., the non-inverting input terminal) is coupled to the second output terminal O2 and receives the second bias voltage $V_{IC}$. The first transistor array 430 includes a plurality of first transistors, and the gates of the first transistors are coupled to the output terminal of the amplifier 420. The first switch array 440 is coupled between the first transistor array 430 and the first output terminal O1 and includes a plurality of first switches. The number of the turned-on switches in the first switch array 440 is controlled by the calibration code CIP_I.

The reference voltage generation circuit 470 provides the reference voltage $Y_R$. The second transistor array 460 includes a plurality of second transistors which are coupled to the reference voltage generation circuit 470. The second switch array 450 is coupled between the second transistor array 460 and the third output terminal O3 and includes a plurality of second switches. The number of turn-on switches in the second switch array 450 is controlled by the calibration code CIP_I. Because of the inverter 480, the calibration code received by the first switch array 440 is the inverse of the calibration code received by the second switch array 450.

The resistor R1_I and the resistor R2_I are connected in series between the first output terminal O1 and the third output terminal O3. More specifically, the resistor R1_I is coupled between the first output terminal O1 and the second output terminal O2, and the resistor R2_I is coupled between the second output terminal O2 and the third output terminal O3. The resistance value of the resistor R1_I may or may not be equal to that of the resistor R2_I.

Figure 7:
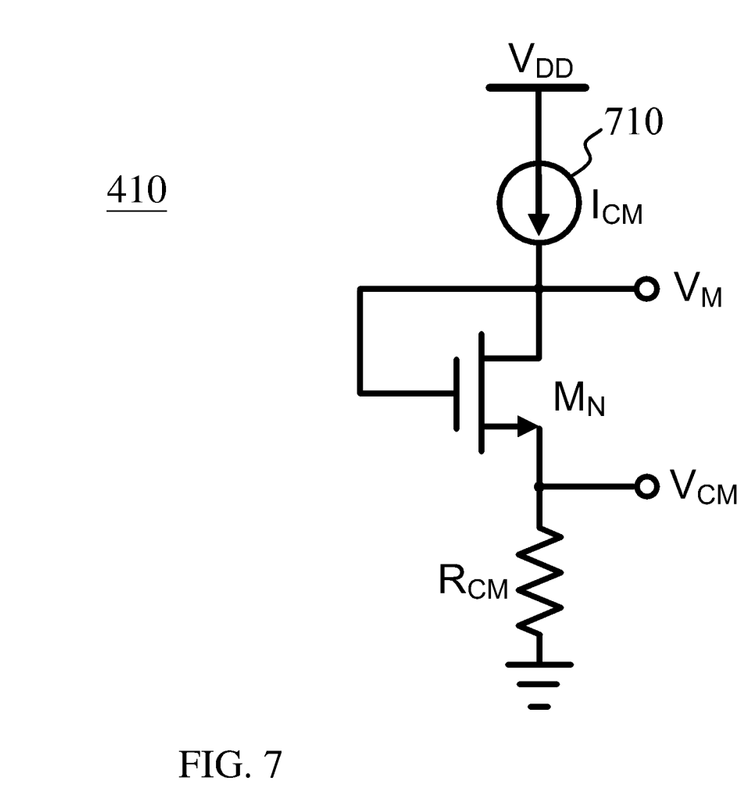
FIG. 7 illustrates a circuit diagram of a reference voltage generation circuit according to an embodiment of the present invention.

The amplifier 420 can be implemented, for example, by an error amplifier. The reference voltage generation circuit 410 and the amplifier 420 constitute a common-mode voltage tracking circuit 405, that is, the second bias voltage $V_{IC}$ (i.e., the output of the second output terminal O2 and the input of the amplifier 420) is related to the common-mode voltage $V_{CM\_I}$. In one embodiment, the second bias voltage $V_{IC}$ increases as the common-mode voltage $V_{CM\_I}$ increases, and the second bias voltage $V_{IC}$ decreases as the common-mode voltage $V_{CM\_I}$ decreases. The reference voltage $V_M$ can be designed as $V_M = V_{CM\_I} + V_{th}$, where $V_{th}$ is the threshold voltage of the switching transistors $M_{MIX\_1}$ to $M_{MIX\_4}$ in the mixer core 320. FIG. 7 is a circuit diagram of the reference voltage generation circuit 410 according to an embodiment of the present invention. The reference voltage generation circuit 410 includes a current source 710, a transistor $M_N$, and a resistor $R_{CM}$. The voltage $V_{CM}$ is the common-mode voltage ($V_{CM\_I}$ or $V_{CM\_Q}$) of the TIA.

Figure 8:
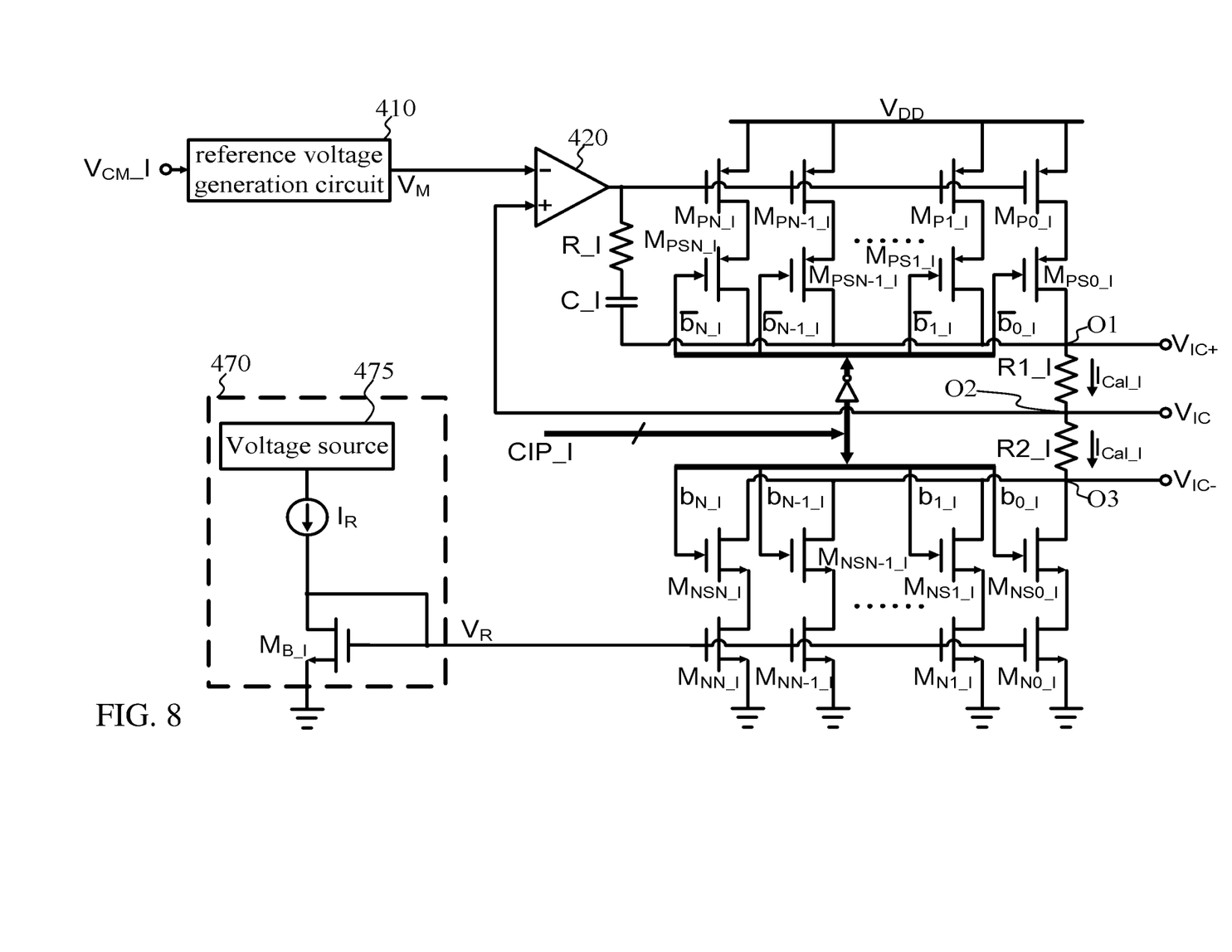
FIG. 8 illustrates a detailed circuit diagram of a mixer bias circuit for the I-path or the Q-path according to one embodiment of the present invention.

FIG. 8 is a detailed circuit diagram of a mixer bias circuit for the I-path or the Q-path according to one embodiment of the present invention. The pass transistors $M_{P0\_I}$, $M_{P1\_I}$, ... $M_{PN-1\_I}$, $M_{PN\_I}$ are first transistors that constitute the first transistor array 430. The switching transistors $M_{PS0\_1}$, $M_{PS1\_I}$, $M_{PSN-1\_I}$, $M_{PSN\_I}$ are first switches that constitute the first switch array 440. The gates of the first transistors are coupled to the output terminal of the amplifier 420. The first transistors are in one-to-one correspondence with the first switches (there are N+1 first transistors and N+1 first switches). More specifically, the pass transistor $M_{P0\_I}$ is connected in series with the switching transistor $M_{PS0\_I}$, the pass transistor $M_{P1\_I}$ is connected in series with the switching transistor $M_{PS1\_I}$, and so on.

Similarly, the current cell transistors $M_{N0\_I}$, $M_{N1\_I}$, ... $M_{NN-1\_I}$, $M_{NN\_I}$ are second transistors that constitute the second transistor array 460. The switching transistors $M_{NS0\_I}$, $M_{NS1\_I}$ ... $M_{NSN-1\_I}$, $M_{NSN\_I}$ are second switches that constitute the second switch array 450. The gates of the second transistors are coupled to the reference voltage generation circuit 470. The second transistors are in one-to-one correspondence with the second switches (there are N+1 second transistors and N+1 second switches). More specifically, the current cell transistor $M_{N0\_1}$ is connected in series with the switching transistor $M_{NS0\_1}$, the current cell transistor $M_{N1\_1}$ is connected in series with the switching transistor $M_{Ns1\_1}$, and so on.

The amplifier 420 controls the gate of pass transistors $M_{P0\_Q}$ to $M_{PN\_I}$ to keep the input voltage of the non-inverting input terminal in the amplifier 420 at the same level as the reference voltage $V_M$. When the common-mode voltage $V_{CM\_I}$ is increased, the amplifier 420 lowers the gate voltage of pass transistors $M_{P0\_I}$ to $M_{PN\_I}$. This increases the conduction level of pass transistors $M_{P0\_I}$ to $M_{PN\_I}$, and the second bias voltage $V_{IC}$ rises again to the regulated voltage of the increased common-mode voltage $V_{CM\_I}$. Conversely, the second bias voltage $V_{IC}$ decreases as the common-mode voltage $V_{CM\_I}$ decreases. In this configuration, the pass transistors $M_{P0\_I}$ to $M_{PN\_I}$ can be controlled very close to the MOSFET ON level, which makes it possible to operate the second bias voltage $V_{IC}$ very close to the reference voltage $V_M$. Additionally, the feature of a common-mode voltage tracking is introduced to ensure that the gate bias voltages $V_{IC}$, $V_{IC+}$, and $V_{IC-}$ of the switching transistors in the mixer 120 is dynamically working at a critical bias point versus a common-mode voltage variation from a TIA. As mentioned above, the gate bias voltages $V_{IC}$, $V_{IC+}$, and $V_{IC-}$ are also dynamically tracking with the common-mode voltage $V_{CM\_I}$ and subsequently minimizes the variation in the optimized IP2 calibration, when a common-mode voltage variation is caused by a TIA.

The reference voltage generation circuit 470 includes a voltage source 475, a current source $I_R$, and a current sink transistor $M_{B\_I}$. The voltage source 475 is, for example, a bandgap voltage reference circuit that can provide a stable voltage. The reference voltage generation circuit 470 provides a reference voltage $Y_R$ at the gate of the current sink transistor $M_{B\_I}$. The gate of each of the second transistors of the second transistor array 460 is coupled to the gate of the current sink transistor $M_{B\_I}$, such that each of the second transistors pairs with the current sink transistor $M_{B\_I}$ to form a current mirror.

The number of bits of the calibration code CIP_I is equal to the number of the first (or second) switches (the number being N+1), and the bits of the calibration code CIP_I are in one-to-one correspondence with the first (or second) switches. That is to say, the least significant bit (LSB) of the calibration code CIP_I ($b_{0\_I}$) controls the transistors $M_{PS0\_I}$ and $M_{NS0\_I}$ to be turned on or off, and the most significant bit (MSB) of the calibration code CIP_I ($b_{N\_I}$) controls the transistors $M_{PSN\_I}$ and $M_{NSN\_I}$ to be turned on or off. The first switch and the second switch are turned on or off in pairs. For example, the transistors $M_{PS0\_I}$ and $M_{NS0\_I}$ are controlled by the bit $b_{0\_I}$ to be simultaneously turned on or off, the transistors $M_{PS1\_I}$ and $M_{NS1\_I}$ are controlled by the bit $b_{1\_I}$ to be simultaneously turned on or off, . . . , the transistors $M_{PSN\_I}$ and $M_{NSN\_I}$ are controlled by the bit $b_{N\_I}$ to be simultaneously turned on or off. In a preferred embodiment, N is an integer greater than or equal to one.

The correction current $I_{CAL\_I}$ can be expressed as follows, where $I_{MPn\_I}$ is the drain current of the $n^{th}$ pass transistor $M_{Pn\_I}$, and $I_{MNn\_I}$ is the drain current of the $n^{th}$ current cell transistor $M_{Nn\_I}$):

$$I_{Cal\_I} = \sum_{n=0}^{N} I_{MPn\_I} = \sum_{n=0}^{N} I_{MNn\_I} \quad (1)$$

By changing the value of the calibration code CIP_I, the correction current $I_{CAL\_I}$ can be trimmed, which in turn trims the first bias voltage $V_{IC+}$ and the third bias voltage $V_{IC-}$. Therefore, the voltage drops $I_{Cal\_I} \times R1\_I$ and $I_{Cal\_I} \times R2\_I$ can be generated according to N+1 bits calibration code for I-path (CIP_I) to trim the gate bias voltage of the switching transistors $M_{MIX\_1}$ and $M_{MIX\_4}$ in the mixer 120. The first bias voltage $V_{IC+}$ and the third bias voltage $V_{IC-}$ can be denoted as $V_{IC+}=V_{IC}+I_{Cal\_I} \times R1\_I$ and $V_{IC-}=V_{IC}-I_{Cal\_I} \times R2\_I$, respectively. Because the characteristic of the I-path chain may be different from that of the Q-path chain, the baseband processor 160 generates the N+1 bits calibration code for the I-path chain (CIP_I) and the N+1 bits calibration code for the Q-path chain (CIP_Q). Because the calibration code CIP_I may be independent of the calibration code CIP_Q, the first bias voltage $V_{IC+}$ and the third bias voltage $V_{IC-}$ for the I-path may be different from the first bias voltage $V_{IC+}$ and the third bias voltage $V_{QC-}$ for the Q-path. Additionally, the calibration codes CIP_I and CIP_Q are controlled and generated according to an IP2 algorithm via the baseband processor 160.

The resistor R_I and capacitor C_I are connected in series to form a feedforward path and subsequently improves the stability of the I-path IP2 calibration working at the LSB of the N+1 bits calibration code for the I-path. The resistor R_I and the capacitor C_I are optional, that is, the output terminal of the amplifier 420 can alternatively be coupled to the first output terminal O1 directly. The current source $I_R$ can be a current source having characteristics independent of absolute temperature to prevent the variation in the IP2 performance versus temperature.

FIGS. 5, 6 and 8 are illustrative circuits for the I-path. The mixer bias circuits for the I-path and the Q-path are substantially the same; people having ordinary skill in the art can understand details for the Q-path based on the above discussions. The mixer bias circuits for the I-path and the Q-path can share the voltage source 475 and the current source $I_R$. Although the transistors in the illustrative circuits as shown in the figures are implemented by MOSFETs, people having ordinary skill in the art can use other types of transistors based on the above discussions, such as bipolar junction transistors (BJTs).

The proposed mixer bias circuit, which has IP2 calibration function and acts as DC gate biasing for the switching transistors in a mixer, is used to reduce the imbalance between the I-path and Q-path chains of a direct-conversion RF RXFE, as shown in FIG. 4. By asymmetrically trimming the gate voltages $V_{IC}$, $V_{IC+}$, $V_{IC-}$, $V_{QC}$, $V_{QC+}$, and $V_{QC-}$ of the switching transistors in the mixer 120 and the mixer 125, the imbalance and mismatch effects can be compensated, resulting in an IP2 improvement of an RF RXFE.

From another perspective, the mixer bias circuit 400a for the I-path comprises a common-mode voltage tracking circuit 405 and N+1 bits complementary array based low-dropout regulator (LDO). As shown in FIGS. 6 and 8, the N+1 bits complementary array based LDO includes the amplifier 420, the first transistor array 430, the first switch array 440, the resistor R1_I, the resistor R2_I, the second switch array 450, the second transistor array 460 and the current sink transistor $M_{B\_I}$. Here, the term "complementary" indicates that the P-channel MOSFETs (hereinafter referred to as PMOSs) and NMOSs are simultaneously employed in the circuits. The proposed N+1 bits complementary array based LDO, which is a multiple-input multiple-output (MIMO) architecture (multiple bits input and multiple voltages output), is useful for trimming the gate bias voltages of the switching transistors $M_{MIX\_1}$ to $M_{MIX\_4}$ in a mixer.

In some embodiments, the above-mentioned resistors are resistive components implemented by active components, such as MOSFETs or junction field-effect transistors (JFETs). For a JFET under certain operating conditions, the resistance of the drain-source channel is a function of the gate-source voltage alone and the JFET will behave as an almost pure ohmic resistor.

Please note that the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A mixer bias circuit applied to a radio frequency (RF) receiver front-end (RXFE), the RF RXFE including a mixer and a trans-impedance amplifier (TIA), the mixer bias circuit having a first output terminal, a second output terminal, and a third output terminal that respectively output a first bias voltage, a second bias voltage, and a third bias voltage, the mixer bias circuit comprising:

a first reference voltage generation circuit configured to generate a reference voltage according to a common-mode voltage of the TIA;

an amplifier that is coupled to the first reference voltage generation circuit and that has a first input terminal for receiving the reference voltage, a second input terminal coupled to the second output terminal and for receiving the second bias voltage, and an output terminal;

a first transistor array including a plurality of first transistors;

a first switch array coupled between the first transistor array and the first output terminal and including a plurality of first switches, wherein a total number of the first switches that are to be turned on is based on a calibration code;

a second reference voltage generation circuit;

a second transistor array including a plurality of second transistors coupled to the second reference voltage generation circuit;

a second switch array coupled between the second transistor array and the third output terminal and including a plurality of second switches, wherein a total number of the second switches that are to be turned on is based on the calibration code;

a first resistive component coupled between the first output terminal and the second output terminal and having a first resistance; and a second resistive component coupled between the second output terminal and the third output terminal and having a second resistance.

2. The mixer bias circuit of claim 1, wherein the first transistors are in one-to-one correspondence with the first switches, and the second transistors are in one-to-one correspondence with the second switches.

3. The mixer bias circuit of claim 2, wherein a total number of the first switches is equal to a total number of the second switches, and a total number of the first switches that are turned on is equal to a total number of the second switches that are turned on.

4. The mixer bias circuit of claim 2, wherein sources of the first switches are coupled to drains of the corresponding first transistors, gates of the first switches receive the calibration code, and drains of the first switches are coupled to the first output terminal; sources of the second switches are coupled to drains of the corresponding second transistors, gates of the second switches receive the calibration code, and drains of the second switches are coupled to the third output terminal.

5. The mixer bias circuit of claim 1, wherein a total number of the first switches is equal to a total number of the second switches.

6. The mixer bias circuit of claim 1 further comprising:
a third resistive component having a third resistance; and
a capacitor;
wherein the third resistive component and the capacitor are connected in series between the output terminal of the amplifier and the first output terminal.

7. The mixer bias circuit of claim 1, wherein gates of the first transistors are coupled to the output terminal of the amplifier, and gates of the second transistors receive a bias voltage that the second reference voltage generation circuit provides.

* * * * *